(12) United States Patent
Pendse

(10) Patent No.: US 8,278,144 B2
(45) Date of Patent: Oct. 2, 2012

(54) FLIP CHIP INTERCONNECT SOLDER MASK

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 403 days.

(21) Appl. No.: 12/362,627

(22) Filed: Jan. 30, 2009

(65) Prior Publication Data

US 2009/0184419 A1 Jul. 23, 2009

Related U.S. Application Data

(63) Continuation of application No. 11/435,555, filed on May 16, 2006, now abandoned.

(60) Provisional application No. 60/594,885, filed on May 16, 2005.

(51) Int. Cl.
*H01L 21/50* (2006.01)

(52) U.S. Cl. .. 438/108; 438/612; 438/614; 257/E21.503

(58) Field of Classification Search ................. 438/108, 438/107, 129, 612, 637, 614; 257/E21.503
See application file for complete search history.

(56) References Cited

U.S. PATENT DOCUMENTS

| | | | |
|---|---|---|---|
| 5,378,859 A | 1/1995 | Shirasaki et al. | |
| 5,386,624 A | 2/1995 | George et al. | |
| 5,434,410 A | 7/1995 | Kulwicki | |
| 5,508,561 A | 4/1996 | Tago et al. | |
| 5,517,756 A | 5/1996 | Shirai et al. | |
| 5,519,580 A | 5/1996 | Natarajan et al. | |
| 5,650,595 A | 7/1997 | Bentlage et al. | |
| 5,710,071 A | 1/1998 | Beddingfield et al. | |
| 5,798,285 A * | 8/1998 | Bentlage et al. | 438/108 |
| 5,844,782 A | 12/1998 | Fukasawa | |
| 5,869,886 A | 2/1999 | Tokuno | |
| 5,872,399 A | 2/1999 | Lee | |
| 5,889,326 A | 3/1999 | Tanaka | |
| 5,915,169 A | 6/1999 | Heo | |
| 5,985,456 A | 11/1999 | Zhou et al. | |
| 6,049,122 A | 4/2000 | Yoneda | |

(Continued)

FOREIGN PATENT DOCUMENTS

JP 04-355933 9/1992

(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Michael Trinh
(74) *Attorney, Agent, or Firm* — Robert D. Atkins; Patent Law Group: Atkins & Associates, P.C.

(57) ABSTRACT

A solder mask for flip chip interconnection has a common opening that spans a plurality of circuit elements. The solder mask allows confinement of the solder during the remelt stage of interconnection, yet it is within common design rules for solder mask patterning. Also, a substrate for flip chip interconnection includes a substrate having the common opening that spans a plurality of circuit elements. Also, a flip chip package includes a substrate having a common opening that spans a plurality of circuit elements.

23 Claims, 3 Drawing Sheets

U.S. PATENT DOCUMENTS

| | | | |
|---|---|---|---|
| 6,201,305 B1 | 3/2001 | Darveaux et al. |
| 6,218,630 B1 | 4/2001 | Takigami |
| 6,228,466 B1 | 5/2001 | Tsukada et al. |
| 6,229,711 B1 | 5/2001 | Yoneda |
| 6,259,163 B1 | 7/2001 | Ohuchi et al. |
| 6,281,450 B1 | 8/2001 | Urasaki et al. |
| 6,297,560 B1 | 10/2001 | Capote et al. |
| 6,324,754 B1 | 12/2001 | DiStefano et al. |
| 6,329,605 B1 | 12/2001 | Beroz et al. |
| 6,335,568 B1 | 1/2002 | Yuzawa et al. |
| 6,335,571 B1 | 1/2002 | Capote et al. |
| 6,396,707 B1 | 5/2002 | Huang et al. |
| 6,441,316 B1 | 8/2002 | Kusui |
| 6,448,665 B1 | 9/2002 | Nakazawa et al. |
| 6,573,610 B1 | 6/2003 | Tsai |
| 6,600,234 B2 | 7/2003 | Kuwabara et al. |
| 6,608,388 B2 | 8/2003 | Lin et al. |
| 6,710,458 B2 | 3/2004 | Seko |
| 6,734,557 B2 | 5/2004 | Taniguchi et al. |
| 6,774,497 B1 | 8/2004 | Qi et al. |
| 6,780,673 B2 | 8/2004 | Venkateswaran |
| 6,787,918 B1 | 9/2004 | Tsai et al. |
| 6,809,262 B1 | 10/2004 | Hsu |
| 6,818,545 B2 | 11/2004 | Lee et al. |
| 6,849,944 B2 | 2/2005 | Murtuza et al. |
| 6,870,276 B1 | 3/2005 | Moxham et al. |
| 6,888,255 B2 | 5/2005 | Murtuza et al. |
| 6,913,948 B2 | 7/2005 | Caletka et al. |
| 6,916,685 B2 | 7/2005 | Yang et al. |
| 7,005,585 B2 | 2/2006 | Ishizaki |
| 7,005,750 B2 | 2/2006 | Liu |
| 7,049,705 B2 | 5/2006 | Huang |
| 7,057,284 B2 | 6/2006 | Chauhan et al. |
| 7,064,435 B2 | 6/2006 | Chung et al. |
| 7,098,407 B2 | 8/2006 | Kim et al. |
| 7,102,239 B2 | 9/2006 | Pu et al. |
| 7,173,828 B2 | 2/2007 | Lin et al. |
| 7,224,073 B2 | 5/2007 | Kim |
| 7,242,099 B2 | 7/2007 | Lin et al. |
| 7,271,484 B2 | 9/2007 | Reiss et al. |
| 7,294,929 B2 | 11/2007 | Miyazaki |
| 7,405,484 B2 | 7/2008 | Usui et al. |
| 7,642,660 B2 | 1/2010 | Tay et al. |
| 7,902,679 B2 | 3/2011 | Lin et al. |
| 2002/0162684 A1 | 11/2002 | Sorimachi et al. |
| 2003/0164551 A1* | 9/2003 | Lee et al. ............ 257/778 |
| 2004/0040742 A1 | 3/2004 | Ishizaki |
| 2004/0056341 A1 | 3/2004 | Endo et al. |
| 2004/0159957 A1 | 8/2004 | Lee |
| 2004/0232562 A1 | 11/2004 | Hortaleza et al. |
| 2005/0062149 A1* | 3/2005 | Karnezos et al. ............ 257/712 |
| 2005/0103516 A1 | 5/2005 | Kaneyuki |
| 2006/0033210 A1* | 2/2006 | Chauhan et al. ............ 257/737 |

FOREIGN PATENT DOCUMENTS

| | | |
|---|---|---|
| JP | 10-256307 | 9/1998 |
| JP | 2000-031204 | 1/2000 |
| JP | 2004-221205 | 5/2004 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

* cited by examiner

FLIP CHIP INTERCONNECT SOLDER MASK

CLAIM OF DOMESTIC PRIORITY

The present application is a continuation of U.S. patent application Ser. No. 11/435,555, filed May 16, 2006, now abandoned which claims priority from U.S. Provisional Application No. 60/594,885, filed May 16, 2005, and claims priority to the foregoing application(s) pursuant to 35 U.S.C. §120.

BACKGROUND

This invention relates to semiconductor packaging and, particularly, to flip chip interconnection.

Flip chip packages include a semiconductor die mounted onto a package substrate with the active side of the die facing the substrate. Conventionally, interconnection of the circuitry in the die with circuitry in the substrate is made by way of bumps which are attached to an array of interconnect pads on the die, and bonded to a corresponding (complementary) array of interconnect pads (often referred to as "capture pads") on the substrate.

The areal density of electronic features on integrated circuits has increased enormously, and chips having a greater density of circuit features also may have a greater density of sites for interconnection with a package substrate.

The package is connected to underlying circuitry, such as a printed circuit board (e.g., a "motherboard") in the device in which it is employed, by way of second level interconnects (e.g., pins, solder balls) between the package and the underlying circuit. The second level interconnects have a greater pitch than the flip chip interconnects, and so the routing on the substrate conventionally "fans out". Significant technological advances have enabled construction of fine lines and spaces; but in the conventional arrangement space between adjacent pads limits the number of traces than can escape from the more inward capture pads in the array, and the fan out routing between the capture pads beneath the die and the external pins of the package is conventionally formed on multiple metal layers within the package substrate. For a complex interconnect array, substrates having multiple layers may be required to achieve routing between the die pads and the second level interconnects on the package.

Multiple layer substrates are expensive, and in conventional flip chip constructs the substrate alone typically accounts for more than half the package cost (about 60% in some typical instances). The high cost of multilayer substrates has been a factor in limiting proliferation of flip chip technology in mainstream products.

In conventional flip chip constructs the escape routing pattern typically introduces additional electrical parasitics, because the routing includes short runs of unshielded wiring and vias between wiring layers in the signal transmission path. Electrical parasitics can significantly limit package performance.

In some conventional processes, flip chip interconnection is made by contacting the bumps or balls on the die with corresponding interconnect sites on the substrate circuitry, and then heating to reflow the fusible portion of the solder bumps (or to reflow the solder bumps in their entirety) to make the electrical connection. In such processes the melted solder may flow from the interconnect site along the metal of the circuitry, depleting the solder at the connection site; and where the bumps are collapsible under reflow conditions the bumps may contact adjacent circuitry or nearby bumps, resulting in electrical failure. To avoid these problems, typically in conventional flip chip packages the solder is confined by a "solder mask", consisting of a layer of dielectric material overlying the patterned metal layer at the die mount surface of the substrate, and having openings each exposing an interconnect site on the underlying circuitry. Process limitations in patterning the solder mask prevent reliably forming well-aligned and consistently dimensioned openings and, accordingly, where a solder mask is employed, substrates having fine circuitry feature dimensions as would be required for finer pitch interconnection are not attainable.

The interconnect pitch in conventional flip chip interconnects is limited in part by the dimensions of the capture pads on the substrate (typically the capture pads are much wider than the circuit elements connecting them). Recently flip chip substrate circuitry design has been disclosed, in which reliable interconnection is made on narrow circuit elements on the substrate, as for example in "bond-on-narrow pad interconnections" (BONP), as described generally in copending U.S. application Ser. No. 11/388,755, filed Mar. 26, 2006; and as for example in "bump-on-lead interconnections" (BOL), as described generally in copending U.S. application Ser. No. 10/985,654, filed Nov. 10, 2004, both incorporated herein by reference. Where a conventional solder mask is to be employed, limitations in the process for patterning the solder mask can limit pitch reduction even in some BONP or BOL substrate configurations. The exposed bondable surface of the lead may be contaminated by or covered by solder mask residue, resulting in an imperfect solder joint; or, the bondable surface of the lead may be inconsistently or only partially exposed at the interconnect site, resulting in an unreliable and inconsistent trace structure.

SUMMARY

Generally according to the invention, a solder mask for flip chip interconnection has a common opening that spans a plurality of circuit elements. The solder mask allows confinement of the solder during the remelt stage of interconnection, yet it is within common design rules for solder mask patterning.

In one general aspect the invention features a flip-chip package substrate, including a patterned metal layer on a die attach side of a dielectric substrate layer, the metal layer including interconnect sites, the substrate including a solder mask having an opening spanning a plurality of the interconnect sites.

In some embodiments the plurality of interconnect sites comprises interconnect sites arranged in a row, and the opening comprises an elongate opening spanning the row.

In some embodiments the opening has an irregular shape.

In some embodiments the interconnect sites are arranged in an array of rows, and the opening comprises an elongate opening spanning one of the rows of interconnect sites.

In some embodiments the invention features a method for making a flip chip interconnection, comprising providing a substrate including a solder mask having an opening spanning a plurality of the interconnect sites, and mounting the chip onto the substrate.

DETAILED DESCRIPTION

Figure 1:
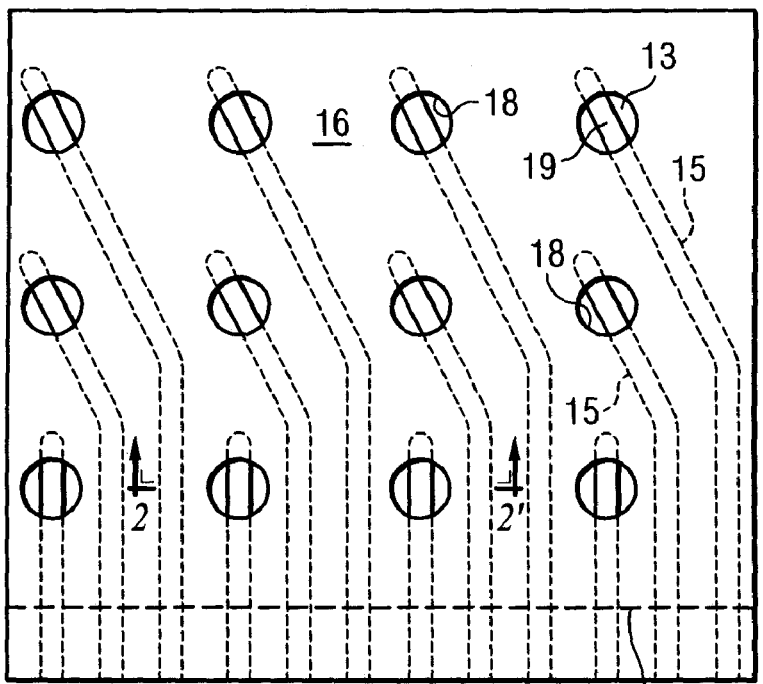
FIG. 1 is a diagrammatic sketch of a portion of a flip chip package substrate employing a conventional solder mask, in a sectional or plan view parallel to the plane of the package substrate surface, as indicated by the arrows 1-1' in FIG. 2.

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

All patents and patent applications referred to above and below are incorporated herein by reference.

The conventional flip chip interconnection is made by using a melting process to join the bumps (conventionally, solder bumps) onto mating surfaces of corresponding interconnect sites on the patterned metal layer at the die attach surface of the substrate. Where the site is a capture pad, the interconnect is known as a "bump-on-capture pad" ("BOC") interconnect; where the site is a lead, or a narrow pad (which may be a modest widening of the circuitry) the interconnect is known as a "bump-on-lead" ("BOL") or "bump on narrow pad" (BONP) interconnect. In the BOC design a comparatively large capture pad is required to mate with the bump on the die. In some flip chip interconnections, an insulating material, typically known as a "solder mask" is required to confine the flow of solder during the interconnection process. The solder mask opening may define the contour of the melted solder at the capture pad ("solder mask defined"), or the solder contour may not be defined by the mask opening ("non-solder mask defined"); in the latter case the solder mask opening may be significantly larger than the interconnect site (capture pad, narrow pad, or lead). As noted above, the techniques for defining solder mask openings have wide tolerance ranges. Consequently, for a solder mask defined bump configuration, the capture pad must be large (typically considerably larger than the design size for the mask opening), to ensure that the mask opening will be located on the mating surface of the pad; and for a non-solder mask defined bump configuration, the solder mask opening must be larger than the capture pad. The width of capture pads (or diameter, for circular pads) is typically about the same as the ball (or bump) diameter (which may be measured at the attachment of the bump with the pad on the die), and can be as much as two to four times wider than the trace width. This results in considerable loss of routing space on the patterned metal layer at the die attach surface of the substrate. In particular, for example, the "escape routing pitch" is much bigger than the finest trace pitch that the substrate technology can offer. This means that a significant number of pads must be routed on lower substrate layers by means of short stubs and vias, often beneath the footprint of the die, emanating from the pads in question.

Significantly finer pitch interconnects may be obtained by employing BOL or BONP design. Various BOL structures, and methods for making them, are described for example in U.S. application Ser. No. 10/985,654, filed Nov. 10, 2004; and various BONP structures, and methods for making them, are described for example in U.S. application Ser. No. 11/388,755, filed Mar. 24, 2006, both of which are incorporated herein by reference.

Figure 2:
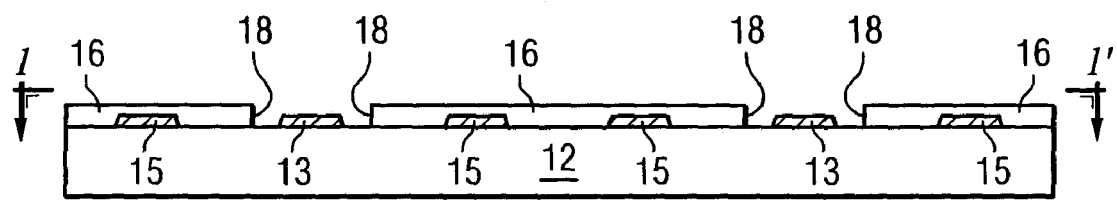
FIG. 2 is a diagrammatic sketch showing a portion of a flip chip package substrate employing a conventional solder mask, in a sectional view perpendicular to the plane of the package substrate surface, as indicated by the arrows 2-2' in FIG. 1.
Figure 3:
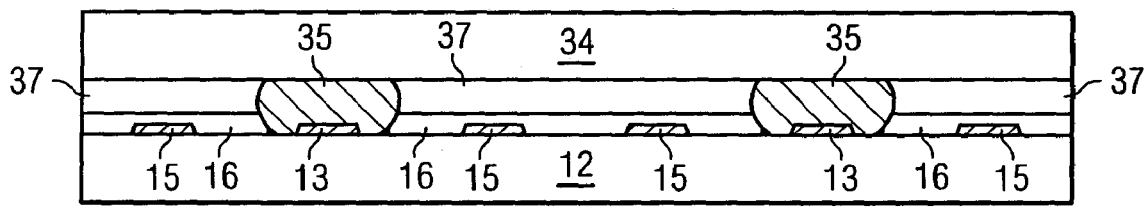
FIG. 3 is a diagrammatic sketch showing a portion of a flip chip assembly including a die interconnected on a substrate as in FIGS. 1 and 2, in a sectional view perpendicular to the plane of the package substrate surface.

FIGS. 1-3 show aspects of a portion of a flip chip interconnection having a conventional solder mask. FIG. 1 shows the substrate, in a diagrammatic sectional view or plan view taken in a plane parallel to the substrate surface. Certain features are shown as if transparent. The substrate includes a dielectric layer 12, supporting a metal layer at the die attach surface, patterned to form circuitry underlying the solder mask. The circuitry includes traces 15 including leads exposed at the interconnect sites 13 by openings 18 in the solder mask 16. The conventional solder mask may have a nominal mask opening diameter in the range about 80 um to 90 um. Solder mask materials can be resolved at such pitches and, particularly, substrates can be made comparatively inexpensively with solder masks having 90 um openings and having alignment tolerances plus or minus 25 um. In some configurations laminate substrates (such as 4 metal layer laminates), made according to standard design rules, are used. In the embodiments of FIGS. 1-3, for example, the traces may be at ~90 um pitch and the interconnection sites may be in a 270 um area array, providing an effective escape pitch ~90 um across the edge of the die footprint, indicated by the broken line 11.

In embodiments as in FIGS. 1-3 the interconnection if the die 34 onto the substrate 12 is achieved by mating each bumps 35 directly onto an interconnect site 13 on a narrow lead or trace 15 patterned on a dielectric layer on the die attach surface of the substrate 12. In this example there is no pad, and the solder mask 16 serves to limit flow of solder within the bounds of the mask openings 18, preventing solder flow away from the interconnect site along the solder-wettable lead. The solder mask may additionally confine flow of molten solder between leads, or this may be accomplished in the course of the assembly process.

As shown in FIG. 3, an underfill 37 between the active side of the die and the die mount surface of the substrate protects the interconnections and mechanically stabilizes the assembly. Underfill materials are known; typically they include a resin, which may be a curable resin, plus a filler, which is typically a fine particulate material (such as, for example, silica or alumina particles). The particular resin and the filler (type of filler material, the particle size(s), e.g.), and the proportion of filler in the resin, are selected to provide suitable properties (mechanical and adhesion) to the underfill material, both during processing and in the resulting underfill. Conventionally the underfill is formed after the interconnection has been made between the interconnect sites on the substrate and the bumps on the die, by applying the underfill material in a liquid form to the narrow space between the die and the substrate near an edge of the die, whereupon the underfill material is permitted to flow by capillary action into the space ("capillary underfill"). Alternatively the underfill can be formed by applying a quantity of underfill material to the active side of the die or to the die mount side of the substrate, then moving the die toward the substrate and pressing the bumps against the interconnect sites ("no-flow underfill"). In packages having a solder mask, as shown for example in FIGS. 1-3, a conventional capillary underfill may be employed.

Figure 4:
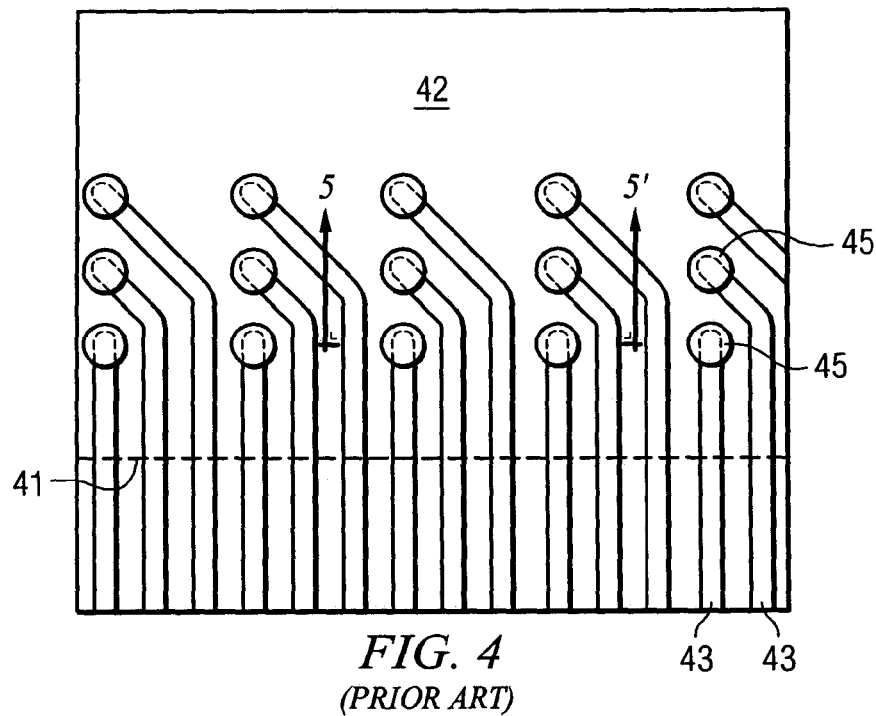
FIG. 4 is a diagrammatic sketch showing a portion of a flip chip interconnection of a die on a substrate having no solder mask, in a sectional view parallel to the plane of the package substrate surface, as indicated by the arrows 4-4' in FIG. 5.
Figure 5:
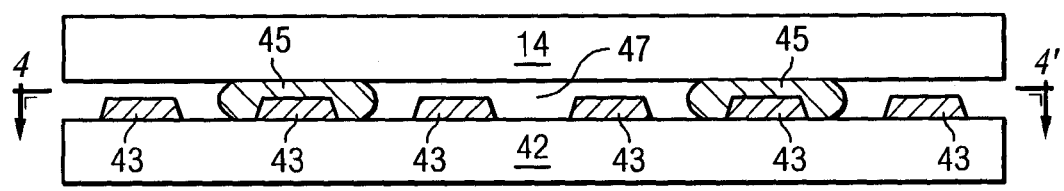
FIG. 5 is a diagrammatic sketch showing a portion of a die on a substrate having no solder mask, in a sectional view perpendicular to the plane of the package substrate surface, as indicated by the arrows 5-5' in FIG. 4.

FIGS. 4 and 5 show aspects of a flip chip interconnection in which no solder mask is employed. FIG. 4 shows a package assembly, in a diagrammatic partial sectional view taken in a plane parallel to the substrate surface, along the lines 4-4' in FIG. 5. Certain features are shown as if transparent. In this example the interconnection is achieved by mating the bumps directly onto respective narrow leads or traces on the substrate and, accordingly, this is referred to herein as a "bump-on-lead" ("BOL") interconnect. Solder mask materials typically cannot be resolved at such fine geometries and, in such package assemblies, no solder mask is used. Instead the function of confining molten solder flow is accomplished without a solder mask in the course of the assembly process, typically a noncollapsible bump is employed together with solder on the lead; or a no-flow underfill process is employed (as described below). FIG. 5 shows a partial sectional view of a package as in FIG. 4, taken in a plane perpendicular to the plane of the package substrate surface, along the line 5-5' in FIG. 4.

FIG. 4 shows by way of example an escape routing pattern for a BOL substrate, arranged for a die on which the die attach pads are in an array of parallel rows near the die perimeter. The bumps 45 are mated onto corresponding interconnect sites on the escape traces 43 in a complementary array near the edge of the die footprint, indicated by the broken line 41. As FIG. 4 illustrates, the routing density achievable using bump-on-lead interconnect can equal the finest trace pitch offered by the substrate technology. In the specific case illustrated, this constitutes a routing density which is approximately 90% higher than is achieved in a conventional bump-on-capture pad arrangement. In the perimeter array version of BOL (e.g., FIG. 4), the bumps are arranged on an area array, providing greater space for a larger bumping and bonding pitch, and relieving the technological challenges for the assembly process. Even in the array example, the routing traces on the substrate are at the same effective pitch as in a perimeter row arrangement, and an arrangement as in FIG. 4 relieves the burden of fine pitch bumping and bonding without sacrificing the fine escape routing pitch advantage.

Referring particularly now to FIGS. 4 and 5, leads 43 are formed by patterning a metal layer on a die attach surface of a substrate dielectric layer 42. Electrical interconnection of the die 14 is made by joining the bumps 45 on the die directly onto the leads 43. Certain of the escape traces, leading across the die edge location from interconnect sites in rows toward the interior of the die footprint, pass between the bumps 45 on more peripheral rows of interconnect sites. No capture pads are required in this example and, owing to the particular manner in which the assembly is made, no solder mask is required; the process is described in detail below.

The BOL interconnection structure such as is shown by way of example in FIGS. 4 and 5 can be made by any of several methods, not requiring a solder mask. In general, interconnect bumps (typically solder bumps) are affixed onto interconnect pads on the active side of the die. A die attach surface of the substrate (termed the "upper" surface) has an upper metal layer patterned to provide the traces as appropriate for interconnection with the arrangement of bumps on the particular die. Because no capture pads are required, the patterned traces (leads) need only route through sites corresponding to a pattern complementary to the arrangement of bumps on the die. In some approaches, an encapsulating resin adhesive is employed in a "no-flow underfill" process to confine the solder flow during a melt phase of the interconnection process. The "no-flow underfill" is applied before the die and the substrate are brought together, and the no-flow underfill is displaced by the approach of the bumps onto the leads, and by the opposed surfaces of the die and the substrate. The adhesive for the no-flow underfill adhesive is preferably a fast-gelling adhesive—that is, a material that gels sufficiently at the gel temperature in a time period in the order of 1-2 seconds. Materials suitable for the no-flow underfill adhesive include, for example, so-called non-conductive pastes, such as those marketed by Toshiba Chemicals and by Loktite-Henkel, for example.

Methods employing a no-flow underfill to confine the solder during the remelt stage are described, for example, in U.S. application Ser. No. 11/435,305 by Rajendra D. Pendse et al., filed May 15, 2006, titled "Flip chip interconnection", which is hereby incorporated herein by reference.

Alternative bump structures may be employed in the bump-on-lead interconnects having no solder mask. Particularly, for example, so-called composite solder bumps may be used. Composite solder bumps have at least two bump portions, made of different bump materials, including one which is collapsible under reflow conditions, and one which is substantially non-collapsible under reflow conditions. The non-collapsible portion is attached to the interconnect site on the die; typical conventional materials for the non-collapsible portion include various solders having a high lead (Pd) content, for example. The collapsible portion is joined to the non-collapsible portion, and it is the collapsible portion that makes the connection with the lead according to the invention. Typical conventional materials for the collapsible portion of the composite bump include eutectic solders, for example.

As outlined above, methods for forming flip chip interconnection having high density have been proposed. However, the density of flip chip interconnection in which a solder mask is desired is limited by process capability of the solder mask patterning process.

According to the invention, a solder mask configuration allows confinement of solder in high-density (fine pitch) flip chip interconnects, yet is within design rules for solder mask patterning.

According to the invention, a solder mask is provided having at least one opening spanning two or more (usually a larger number in a row) circuit elements such as, for example, leads or narrow pads. The opening has a generally elongated shape, and is oriented so that its longer dimension spans the circuit elements, and the shorter dimension limits the extent of exposure of the lengths of the circuit elements. Accordingly, the flow of fusible material that is melted during the reflow step in the interconnection process is limited along the length of the circuit elements (leads, pads) by the width of the solder mask opening, and the number of interconnect sites on which the flow of melted bump material is so limited is determined by the length of the solder mask opening (and, therefore, by the number of pads or leads that are spanned by the opening).

Figure 6:
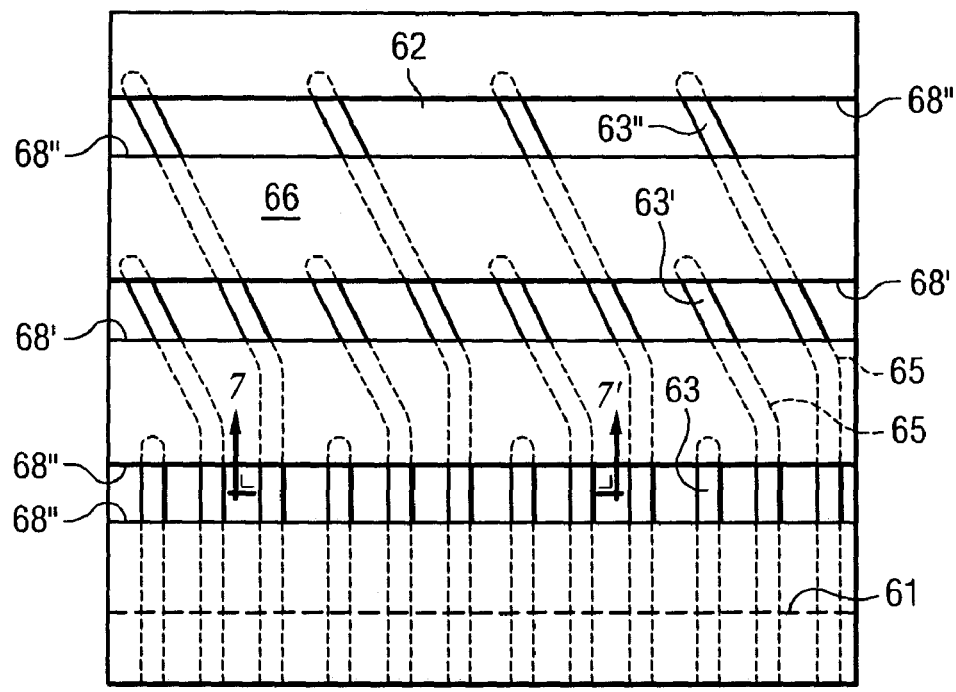
FIG. 6 is a diagrammatic sketch showing a portion of a flip chip package substrate employing a solder mask according to an embodiment of the invention, in a sectional or plan view parallel to the plane of the package substrate surface, as indicated by the arrows 6-6' in FIG. 7.
Figure 7:
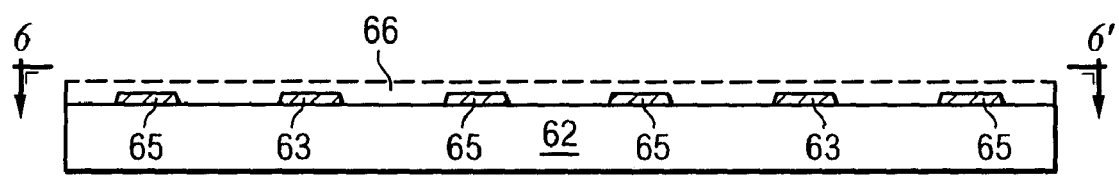
FIG. 7 is a diagrammatic sketch showing a portion of a flip chip interconnection of a die on a substrate employing a solder mask according to an embodiment of the invention, as in FIG. 6, in a sectional view perpendicular to the plane of the package substrate surface, as indicated by the arrows 7-7' in FIG. 6.
Figure 8:
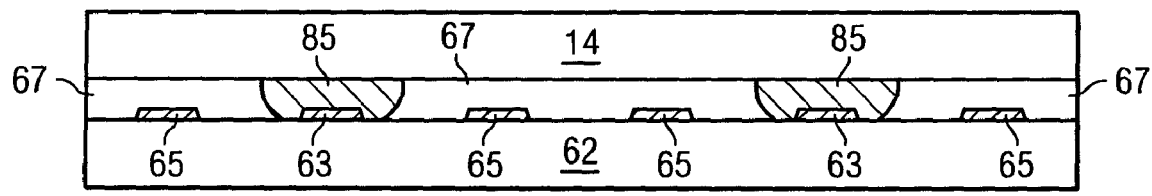
FIG. 8 is a diagrammatic sketch showing a portion of a flip chip assembly including a die interconnected on a substrate as in FIGS. 6 and 7, in a sectional view perpendicular to the plane of the package substrate surface.

An idealized example is shown in FIGS. 6-8. For illustration, the circuitry on the substrate in these FIGs. is similar to that on the substrates in FIGS. 1 and 4. FIG. 6 shows the substrate, in a diagrammatic sectional view or plan view taken in a plane parallel to the substrate surface. Certain features are shown as if transparent. The substrate includes a dielectric layer 62, supporting a metal layer at the die attach surface, patterned to form circuitry underlying the solder mask. The circuitry includes traces 65 including leads exposed at the interconnect sites 63, 63', 63" by elongated openings 68, 68', 68" in the solder mask 66. In this example, the interconnect sites are arranged (as in FIG. 1, for example) in an orthogonal array of 3 rows each generally parallel to the die edge 61, and each of the elongated openings 68, 68', 68" exposes one of the rows of interconnect sites. As FIG. 6 shows, the entire row of interconnect sites 63 is exposed by the opening in the solder mask 66 (the position of the solder mask beyond the section shown at 66 in broken outline in FIG. 7).

As shown in FIG. 8, a flip chip interconnect structure is formed according to the invention by providing a die 14 having bumps attached to die pads, and bonding the bumps 85 onto interconnect sites 63 on the substrate 62.

The width (narrow dimension) of the elongated solder mask serves to limit flow of solder away from the interconnect site along the solder-wettable lead. The width (narrow dimension) of the elongated solder mask opening according to the invention may in some embodiments be determined by the limit of the design rules for patterning the solder mask; it may, for example, approximate the width (or diameter) of a conventional solder mask opening. The width may have a nominal mask width in the range about 80 um to 90 um or less, but it can be 100 um or more. Solder mask materials can be resolved at such pitches and, particularly, substrates can be made comparatively inexpensively with solder masks having 90 um openings and having alignment tolerances plus or minus 25 um. In some configurations laminate substrates (such as 4 metal layer laminates), made according to standard design rules, are used.

According to the invention, the feature sizes required for the solder mask can be made coarser; because the elongate solder mask opening spans a number of leads, the alignment of the mask openings with the interconnect sites can be significantly relaxed. Risk of partial exposure of bondable areas of leads at interconnect sites is practically avoided. Solder run-off along the length of the circuit features at the interconnect sites is confined by the opening (width dimension). And runoff toward adjacent circuit features is mitigated (at least) because the dielectric material of the substrate dielectric is not wettable by the solder.

In some embodiments the interconnect includes a bump, metallurgically joined to an interconnect site (e.g., lead or narrow pad); this may include solder fillets formed along the surrounding surface and exposed sidewalls of the lead.

In some embodiments the interconnect is formed in two broad steps: the bump is thermo-mechanically joined to the lead without melting; and a no-flow underfill is cured to a gel stage; thereafter the bump is melted in a reflow operation to form a reliable interconnection. This confines the joint to a relatively small volume and minimizes the risk of solder bridging to an adjacent circuit element.

Solder paste can be provided at the interconnect sites on the leads, to provide a fusible medium for the interconnect. The paste is dispensed, for example by a standard printing process, then is reflowed, and then may be coined if necessary to provide uniform surfaces to meet the balls. The solder paste can be applied in the course of assembly; or, a substrate may be provided with paste suitably patterned prior to assembly. Other approaches to applying solder selectively to the interconnect sites may be employed in the solder-on-lead embodiments, including electroless plating and electroplating techniques. The solder-on-lead configuration provides additional solder volume for the interconnect, and can accordingly provide higher product yield, and can also provide a higher die standoff.

For interconnection of a die having high-melting temperature solder bumps (such as a high-lead solder, conventionally used for interconnection with ceramic substrates) onto an organic substrate, the solder mask of the invention can be employed to limit the flow of fusible solder paste along the circuit element near the interconnect site. The solder paste can be selected to have a melting temperature low enough that the organic substrate is not damaged during reflow. To form the interconnect in such embodiments the high-melting interconnect bumps are contacted with the solder-on-lead sites, and the remelt fuses the solder-on-lead to the bumps. Where a noncollapsible bump is used, together with a solder-on-lead process, no preapplied adhesive is required, as the displacement or flow of the solder is limited by the fact that only a small quantity of solder is present at each interconnect, and the noncollapsible bump prevents collapse of the assembly.

In other embodiments the solder-on-lead configuration according to the invention is employed for interconnection of a die having eutectic solder bumps.

Packages according to the invention, employing no-flow underfill techniques, can be made for example as follows. A substrate is provided, having at least one dielectric layer and having a metal layer on a die attach surface. The metal layer is patterned to provide circuitry, particularly traces or leads and including sites for interconnection, on the die attach surface. The substrate is supported, for example on a carrier or stage, with a substrate surface opposite the die attach surface facing the support. A die is provided, having bumps attached to die pads on the active side. The bumps include a fusible material which contacts the mating surfaces of the leads. A quantity of an underfill (filled encapsulating resin adhesive) is dispensed over the die attach surface of the substrate, covering at least the interconnect sites on the leads; or over the active side of the die. A pick-and-place tool including a chuck picks up the die by contact of the chuck with the backside of the die. Using the pick-and-place tool, the die is positioned facing the substrate with the active side of the die toward the die attach surface of the substrate; and the die and substrate are aligned and moved one toward the other so that the bumps contact the corresponding interconnect sites on the traces (leads) on the substrate. Then a force is applied to press the bumps onto the mating surfaces at the interconnect sites on the leads. The force must be sufficient at least to displace the adhesive from between the bumps and the mating surfaces at the interconnect sites on the leads. The bumps may be deformed by the force, breaking the oxide film on the contacting surface of the bumps and/or on the mating surface of leads. The deformation of the bumps may result in the fusible material of the bumps being pressed onto the top and over the edges of the lead. The adhesive is caused to cure at least partially, as shown at, as for example by heating to a selected temperature. At this stage the adhesive need only be partially cured, that is, only to an extent sufficient subsequently to prevent flow of molten solder along an interface between the adhesive and the conductive traces. Then the fusible material of the bumps is melted and then is re-solidified, forming a metallurgical interconnection between the bump and lead, and the adhesive curing is completed, to complete the die mount and to secure the electrical interconnection at the mating surface (now an interconnect interface).

In the plane of the sectional view shown in FIG. 8, interconnection is formed between certain of the bumps 85 and corresponding interconnect sites on certain of the leads 63. Other leads 65 are interconnected at other localities, which would be visible in other sectional views. A comparatively high trace density is shown. The curing of the adhesive may be completed prior to, or concurrently with, or following melting the solder. Typically, the adhesive is a thermally curable adhesive, and the extent of curing at any phase in the process is controlled by regulating the temperature. The components can be heated and cured by raising the temperature of the chuck on the pick and place tool, or by raising the temperature of the substrate support, for example.

Other solder mask opening configurations are within the invention. Particularly, the elongated opening may expose interconnect sites on two or more adjacent circuit features; in some embodiments the opening exposes a row of interconnect sites, which may be a row on an array of interconnect sites. The row of interconnect sites exposed need not be in a straight line and, accordingly, the opening need not be rectangular: the opening may have an arcuate shape, or may be irregular. Where the elongated opening has a shape of a regular polygon, such as a rectangle for example, the elongated opening need not necessarily be oriented parallel to a row of interconnect sites or to the die margin.

Where interconnect is formed by a no-flow underfill process, the no-flow underfill adhesive can be pre-applied to the die surface, or at least to the bumps on the die surface, rather than to the substrate. The adhesive can, for example, be pooled in a reservoir, and the active side of the die can be dipped in the pool and removed, so that a quantity of the adhesive is carried on the bumps; then, using a pick-and-place tool, the die is positioned facing a supported substrate with the active side of the die toward the die attach surface of the substrate, and the die and substrate are aligned and moved one toward the other so that the bumps contact the corresponding traces (leads) on the substrate. Such a method is described in U.S. Pat. No. 6,780,682, Aug. 24, 2004, which is hereby incorporated by reference. Then forcing, curing, and melting are carried out as described above.

The adhesive may be referred to as a "no-flow underfill". In some approaches to flip chip interconnection, the metallurgical interconnection is formed first, and then an underfill material is flowed into the space between the die and the substrate. The "no-flow underfill" according to the invention is applied before the die and the substrate are brought together, and the no-flow underfill is displaced by the approach of the bumps onto the leads, and by the opposed surfaces of the die and the substrate. The adhesive for the no-flow underfill adhesive according to the invention is preferably a fast-gelling adhesive—that is, a material that gels sufficiently at the gel temperature in a time period in the order of 1-2 seconds. Preferred materials for the no-flow underfill adhesive include, for example, so-called non-conductive pastes, such as those marketed by Toshiba Chemicals and by Loktite-Henkel, for example.

Alternative bump structures may be employed in the bump-on-lead interconnects according to the invention. Particularly, for example, so-called composite solder bumps may be used. Composite solder bumps have at least two bump portions, made of different bump materials, including one which is collapsible under reflow conditions, and one which is substantially non-collapsible under reflow conditions. The non-collapsible portion is attached to the interconnect site on the die; typical conventional materials for the non-collapsible portion include various solders having a high lead (Pb) content, for example. The collapsible portion is joined to the non-collapsible portion, and it is the collapsible portion that makes the connection with the lead according to the invention. Typical conventional materials for the collapsible portion of the composite bump include eutectic solders, for example.

Other embodiments are within the following claims.

What is claimed is:

1. A method of making a flip-chip semiconductor device, comprising:

providing a substrate having a plurality of traces formed over a surface of the substrate, the surface of the substrate being non-wettable with respect to bump material;

forming a masking layer over the surface of the substrate, the masking layer including a plurality of parallel elongated openings, the masking layer allowing a flow of bump material along a length of the plurality of traces within the plurality of elongated openings and preventing flow of the bump material past a boundary of the plurality of elongated openings, the plurality of elongated openings defining a plurality of interconnect sites on the plurality of traces, and wherein both first and second traces of the plurality of traces are exposed by both first and second elongated openings of the plurality of elongated openings and the first and second traces are parallel with respect to a width across the first elongated opening along the first and second traces and the first and second traces are angled with respect to a width across the second elongated opening along the first and second traces;

disposing a semiconductor die over the substrate with contact pads formed on the semiconductor die aligned with the plurality of interconnect sites;

disposing a no-flow underfill material between the semiconductor die and the substrate; and connecting the contact pads of the semiconductor die to the interconnect sites with composite bumps including a fusible portion and a non-fusible portion by, (a) thermo-mechanically joining the fusible portion of the composite bumps to the interconnect sites without melting the fusible portion, (b) curing the no-flow underfill to a gel stage, and (c) reflowing the fusible portion to form an interconnection between the composite bumps and interconnect sites.

2. The method of claim 1, wherein the width of each of the plurality of elongated openings is less than 90 μm.

3. The method of claim 1, wherein the substrate includes a four metal layer laminate.

4. The method of claim 1, further including forming a plurality of fillets along a surface of the plurality of traces.

5. A method of making a semiconductor device, comprising:

providing a substrate having a plurality of traces formed over a surface of the substrate;

forming a masking layer over the surface of the substrate, the masking layer including a plurality of elongated openings, the masking layer allowing a flow of bump material along a length of the plurality of traces within the plurality of elongated openings and preventing flow of the bump material past a boundary of the plurality of elongated openings, the plurality of elongated openings exposing a plurality of interconnect sites on the plurality of traces, and wherein first and second traces of the plurality of traces are exposed by first and second elongated openings of the plurality of elongated openings and the first and second traces are parallel with respect to a width across the first elongated opening along the first and second traces and the first and second traces are angled with respect to a width across the second elongated opening along the first and second traces;

disposing a semiconductor die over the substrate with contact pads formed on the semiconductor die aligned with the plurality of interconnect sites;

disposing a no-flow underfill material between the semiconductor die and the substrate; and connecting the contact pads of the semiconductor die to the interconnect sites with bumps by,
(a) thermo-mechanically joining the bumps to the interconnect sites without melting the bumps,
(b) curing the no-flow underfill to a gel stage, and
(c) reflowing the bumps to form an interconnection between the bumps and interconnect sites.

6. The method of claim 5, wherein the surface of the substrate is non-wettable with respect to the bump material.

7. The method of claim 5, wherein the bumps include composite bumps having a fusible portion and a non-fusible portion.

8. The method of claim 5, including forming a plurality of fillets along a surface of the plurality of traces.

9. A method of making a semiconductor device, comprising:
providing a substrate having first and second traces formed over a surface of the substrate, each of the traces defining an interconnect site;
forming a masking layer over the surface of the substrate, the masking layer including first and second elongated openings, wherein the first and second traces are exposed by the first and second elongated openings and the first and second traces are parallel with respect to a width across the first elongated opening along the first and second traces and the first and second traces are angled with respect to a width across the second elongated opening along the first and second traces; and
mounting a semiconductor die with a plurality of contact pads to the interconnect site.

10. The method of claim 9, wherein the surface of the substrate is non-wettable with respect to bump material.

11. The method of claim 9, further including:
mounting the semiconductor die over the substrate such that the plurality of contact pads align with respect to the interconnect sites; and
connecting the contact pads of the semiconductor die to the interconnect sites.

12. The method of claim 11, further including forming composite bumps between the contact pads of the semiconductor die and the interconnect sites, wherein the composite bumps include a fusible portion and a non-fusible portion.

13. The method of claim 9, further including forming a plurality of fillets along a surface of the first and second traces.

14. The method of claim 9, further including disposing a no-flow underfill material between the semiconductor die and the substrate.

15. A method of making a semiconductor device, comprising:
providing a substrate having a plurality of traces formed over a surface of the substrate, each of the traces defining an interconnect site;
forming a masking layer over the surface of the substrate, the masking layer including a plurality of elongated openings, at least first and second traces of the plurality of traces passing beneath at least first and second elongated openings of the elongated openings and the first and second traces are parallel with respect to a width across the first elongated opening along the first and second traces and the first and second traces are angled with respect to a width across the second elongated opening along the first and second traces; and
mounting a semiconductor die with a plurality of contact pads to the interconnect site.

16. The method of claim 15, wherein the surface of the substrate is non-wettable with respect to bump material.

17. The method of claim 15, further including forming bumps between the contact pads of the semiconductor die and the interconnect sites, wherein the bumps include composite bumps having a fusible portion and a non-fusible portion.

18. The method of claim 15, further including forming a plurality of fillets along a surface of the plurality of traces.

19. The method of claim 15, further including disposing a no-flow underfill material between the semiconductor die and the substrate.

20. A method of making a semiconductor device, comprising:
providing a substrate having a plurality of traces formed over a surface of the substrate, each of the traces defining an interconnect site;
forming a masking layer over the surface of the substrate, the masking layer including a plurality of elongated openings, at least two of the plurality of traces passing beneath at least one of the elongated openings; and
disposing a semiconductor die over the substrate with contact pads formed on the semiconductor die aligned with the plurality of interconnect sites;
disposing a no-flow underfill material between the semiconductor die and the substrate; and
connecting the contact pads of the semiconductor die to the interconnect sites with bumps by,
(a) thermo-mechanically joining the bumps to the interconnect sites without melting the bumps,
(b) curing the no-flow underfill to a gel stage, and
(c) reflowing the bumps to form an interconnection between the bumps and interconnect sites.

21. The method of claim 20, wherein a width of each of the plurality of elongated openings is less than 90 μm.

22. The method of claim 20, wherein the surface of the substrate is non-wettable with respect to bump material.

23. The method of claim 20, wherein the bumps include composite bumps having a fusible portion and a non-fusible portion.

* * * * *